(12) United States Patent
Shi (10) Patent No.: US 10,205,028 B2
(45) Date of Patent: Feb. 12, 2019

(54) THIN-FILM TRANSISTOR, MANUFACTURING METHOD FOR THE SAME, DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Longqiang Shi, Guangdong (CN)

(73) Assignee: Shenzhen China Star Optoelectroncis Semiconductor Display Technology Co., Ltd, Shenzhen, Guangdong (CN)

( * ) Notice: Subject to any disclaimer, the term of this patent is extended or adjusted under 35 U.S.C. 154(b) by 39 days.

(21) Appl. No.: 15/533,013

(22) PCT Filed: Apr. 10, 2017

(86) PCT No.: PCT/CN2017/079907
§ 371 (c)(1),
(2) Date: Jun. 3, 2017

(87) PCT Pub. No.: WO2018/166018
PCT Pub. Date: Sep. 20, 2018

(65) Prior Publication Data
US 2018/0269331 A1 Sep. 20, 2018

(51) Int. Cl.
*H01L 29/78* (2006.01)
*H01L 29/786* (2006.01)
(Continued)

(52) U.S. Cl.
CPC .... *H01L 29/78693* (2013.01); *H01L 21/0274* (2013.01); *H01L 21/02178* (2013.01);
(Continued)

(58) Field of Classification Search
CPC ........ H01L 29/78693; H01L 29/41733; H01L 29/513; H01L 29/518; H01L 29/66969; H01L 29/78618; H01L 29/78633; H01L 21/02178; H01L 21/02244; H01L 21/02491; H01L 21/02565;
(Continued)

(56) References Cited

U.S. PATENT DOCUMENTS

9,368,441 B2 * 6/2016 Yan .................. H01L 23/564
9,368,637 B2 * 6/2016 Zhang .............. H01L 29/7869
(Continued)

*Primary Examiner* — Andrew Q Tran
(74) *Attorney, Agent, or Firm* — Andrew C. Cheng (57) ABSTRACT

A thin-film transistor, a manufacturing for the same, and a display panel are provided. In the annealing process, the aluminum layer combines with oxygen ions in the amorphous oxide semiconductor layer to form an $Al_2O_3$ layer. The amorphous oxide semiconductor layer loses the oxygen ions, oxygen defects are increased such that a doped region of the semiconductor layer is formed. That is, a source contact region and a drain contact region are formed, and the amorphous oxide semiconductor layer is shielded by the anti-oxidation layer to form the channel region of the semiconductor layer. The present invention can simplify the manufacturing process, increase the production efficiency and decrease the production cost.

16 Claims, 4 Drawing Sheets

(51) Int. Cl.
*H01L 21/02* (2006.01)
*H01L 21/027* (2006.01)
*H01L 27/12* (2006.01)
*H01L 21/4763* (2006.01)
*H01L 29/417* (2006.01)
*H01L 29/51* (2006.01)
*H01L 29/66* (2006.01)
*H01L 27/32* (2006.01)
*G02F 1/1368* (2006.01)

(52) U.S. Cl.
CPC .. *H01L 21/02244* (2013.01); *H01L 21/02491* (2013.01); *H01L 21/02565* (2013.01); *H01L 21/02592* (2013.01); *H01L 21/47635* (2013.01); *H01L 27/127* (2013.01); *H01L 27/1225* (2013.01); *H01L 27/1288* (2013.01); *H01L 29/41733* (2013.01); *H01L 29/513* (2013.01); *H01L 29/518* (2013.01); *H01L 29/66969* (2013.01); *H01L 29/78618* (2013.01); *H01L 29/78633* (2013.01); *G02F 1/1368* (2013.01); *G02F 2001/13685* (2013.01); *G02F 2202/10* (2013.01); *H01L 21/0217* (2013.01); *H01L 21/02164* (2013.01); *H01L 21/02271* (2013.01); *H01L 27/3262* (2013.01)

(58) Field of Classification Search
CPC ........... H01L 21/02592; H01L 21/0274; H01L 21/47635; H01L 27/1225; H01L 27/127; H01L 27/1288
See application file for complete search history.

(56) References Cited

U.S. PATENT DOCUMENTS

| | | |
|---|---|---|
| 2009/0283763 A1 | 11/2009 | Park |
| 2015/0214373 A1 | 7/2015 | Zhang et al. |
| 2015/0348894 A1 | 12/2015 | Yan et al. |

\* cited by examiner

THIN-FILM TRANSISTOR, MANUFACTURING METHOD FOR THE SAME, DISPLAY PANEL

BACKGROUND OF THE INVENTION

1. Field of the Invention

The present invention relates to a display technology field, and more particularly to a thin-film transistor, manufacturing method for the same, and a display panel having the thin-film transistor.

2. Description of Related Art

Along with the increase of the display panel size and clarity, the Thin Film Transistor (TFT) having large electron mobility has become a rising star, and shown a huge market application prospect. For example, the industry generally adopts IGZO (Indium Gallium Zinc Oxide) to manufacture a semiconductor layer of the TFT, and the semiconductor layer is also called as an IGZO (Indium Gallium Zinc Oxide) channel layer. In order to ensure a good contact among the source electrode, the drain electrode and the semiconductor layer, a doped region is required and the electrical stability of the channel region of the semiconductor layer should also be guaranteed. Accordingly, the manufacturing process is complex in order to affect the production efficiency so that the production cost remains high.

SUMMARY OF THE INVENTION

Accordingly, the present invention provides a thin-film transistor, a manufacturing for the same, and a display panel, which can simplify the manufacturing process, increase the production efficiency and decrease the production cost.

A manufacturing method for a thin-film transistor according to an embodiment of the present invention comprises:
sequentially forming an aluminum layer and an anti-oxidation layer having a preset pattern on a base substrate, wherein the base substrate is provided with a first region, a second region and a third region arranged adjacently along a direction in parallel with the base substrate, the aluminum layer is formed in the first region, the second region and the third region, and the anti-oxidation layer is formed in the second region;
forming an amorphous oxide semiconductor layer covering the aluminum layer on the anti-oxidation layer;
performing an annealing treatment to the amorphous oxide semiconductor layer such that in the annealing treatment, the aluminum layer at the first region and the third region generates an oxidation reaction in order to form $Al_2O_3$; the amorphous oxide semiconductor layer at the first region and the third region generates a crystallization reaction in order to form a source contact region and a drain contact region, and form a channel region at the second region shielded by the anti-oxidation layer;
forming a gate insulation layer on the amorphous oxide semiconductor layer after being performed with the annealing treatment;
forming a gate electrode pattern on the gate insulation layer, the gate electrode pattern is located between the source contact region and the drain contact region, and located correspondingly above the channel region;
forming an interlayer dielectric layer on the gate electrode pattern; and
forming a source electrode pattern and a drain electrode pattern on the interlayer dielectric layer, the source electrode pattern is connected with the source contact region and the drain electrode pattern is connected with the drain contact region.

A thin-film transistor according to an embodiment of the present invention comprises:
a $Al_2O_3$ layer and an aluminum layer having a preset pattern on a base substrate, wherein the base substrate is provided with a first region, a second region and a third region arranged adjacently along a direction in parallel with the base substrate, the $Al_2O_3$ layer is formed in the first region and the third region, and the aluminum layer is formed in the second region;
an anti-oxidation layer located on the aluminum layer, and an orthographic projection of the anti-oxidation layer on the base substrate is overlapped with the second region;
a semiconductor layer located on the anti-oxidation layer and including a source contact region, a drain contact region and a channel region, an orthographic projection of the source contact region on the base substrate is overlapped with the first region, an orthographic projection of the drain contact region on the base substrate is overlapped with the third region, and an orthographic projection of the channel region on the base substrate is overlapped with the second region;
a gate insulation layer located on the semiconductor layer;
a gate electrode pattern located on the gate insulation layer, and the gate electrode pattern is located between the source contact region and the drain contact region, and located correspondingly above the channel region;
an interlayer dielectric layer located on the gate electrode pattern; and
a source electrode pattern and a drain electrode pattern on the interlayer dielectric layer, wherein the source electrode pattern is connected with the source contact region and the drain electrode pattern is connected with the drain contact region.

A display panel according to an embodiment of the present invention comprises the above thin-film transistor.

Through the above solution, for the embodiment of the present invention, in the annealing process, the aluminum layer combines with oxygen ions in the amorphous oxide semiconductor layer to form an $Al_2O_3$ layer. The amorphous oxide semiconductor layer loses the oxygen ions, oxygen defects are increased such that a doped region of the semiconductor layer is formed. That is, a source contact region and a drain contact region are formed, and the amorphous oxide semiconductor layer is shielded by the anti-oxidation layer to form the channel region of the semiconductor layer. The present invention can simplify the manufacturing process, increase the production efficiency and decrease the production cost.

DETAILED DESCRIPTION OF THE PREFERRED EMBODIMENT

The following will combine the figures in the embodiment of the present invention to describe each exemplary embodiment provided by the present invention clearly and completely. In the absence of conflict, embodiments and features of embodiments can be combined with each other.

Figure 1:
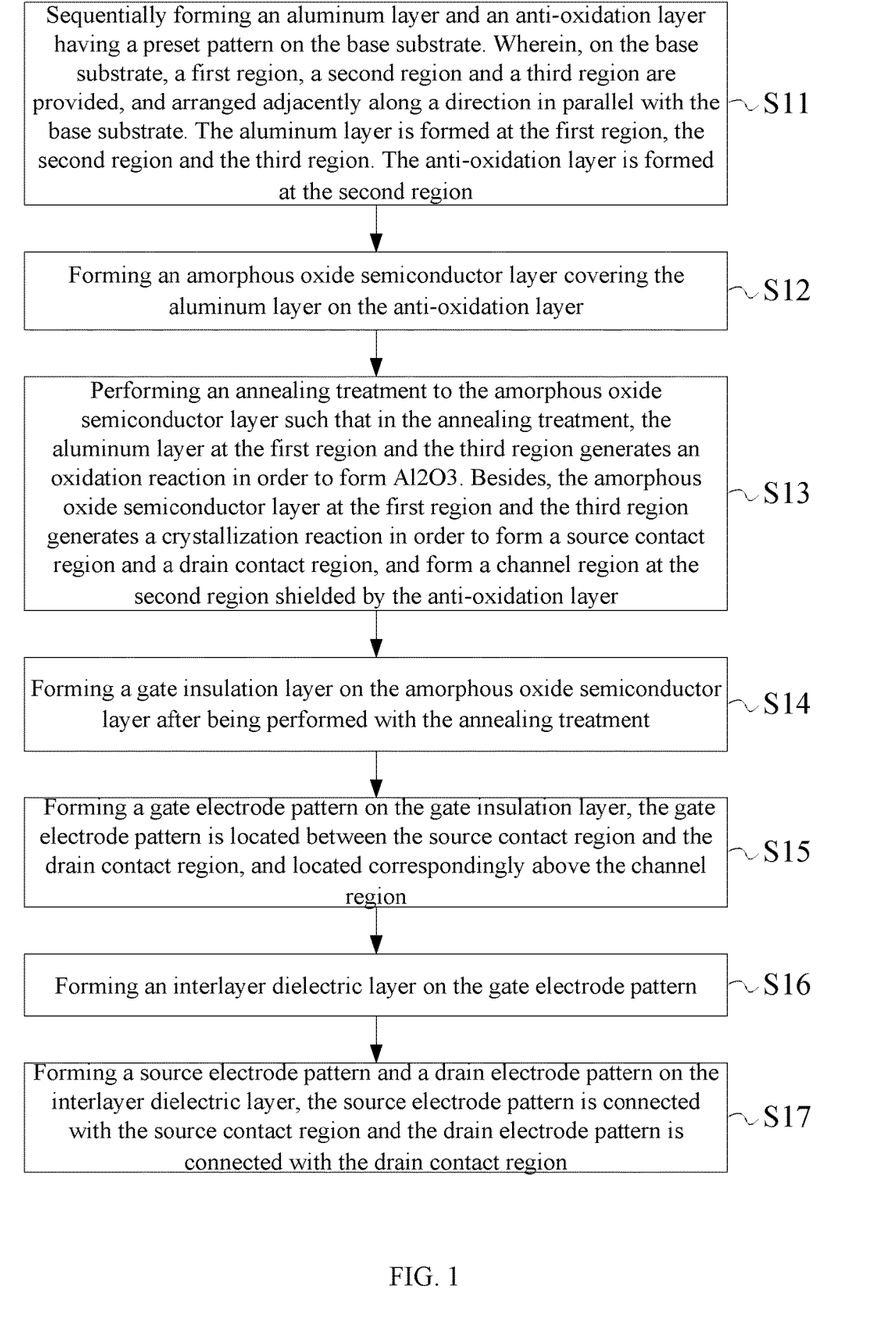
FIG. 1 is a flowchart of a manufacturing method for a thin-film transistor according to an embodiment of the present invention.

With reference to FIG. 1, which is a manufacturing method for a thin-film transistor according to an embodiment of the present invention. The manufacturing method for a thin-film transistor includes following steps S11~S17.

S11: sequentially forming an aluminum layer and an anti-oxidation layer having a preset pattern on the base substrate. Wherein, on the base substrate, a first region, a second region and a third region are provided, and arranged adjacently along a direction in parallel with the base substrate. The aluminum layer is formed at the first region, the second region and the third region. The anti-oxidation layer is formed at the second region.

Figure 2:
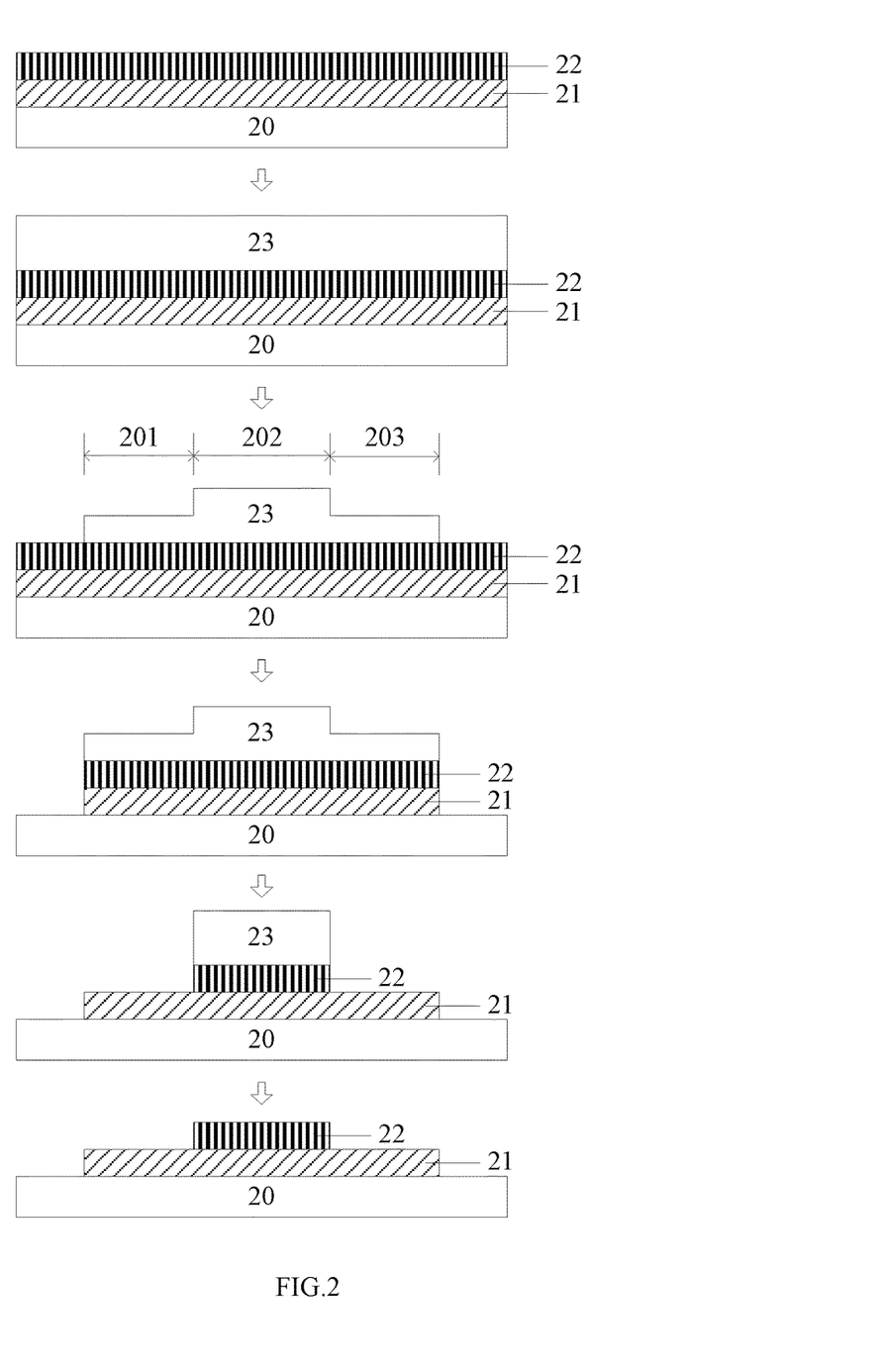
FIG. 2 is a schematic diagram of sequentially forming an aluminum layer and an anti-oxidation layer having a preset pattern on the base substrate based on the method shown in FIG. 1.

An embodiment of the present invention can form the aluminum layer and the anti-oxidation layer having a preset pattern on the base substrate by adopting a method combining exposing and etching. With reference to FIG. 2, specifically:

Firstly, sequentially forming an aluminum layer 21 and an anti-oxidation layer 22 covering the base substrate 20 on the base substrate 20. The base substrate 20 includes but not limited to a transparent substrate such as a glass substrate, a plastic substrate, or a flexible substrate. The present embodiment can adopt a PVD (Physical Vapor Deposition) method to sequentially form an entire surface of the aluminum layer 21, and an entire surface of an anti-oxidation layer 22, and the anti-oxidation layer 22 can be a Mo (molybdenum) layer.

Then, forming a photoresist layer 23 having an entire surface of an even thickness on the anti-oxidation layer 22.

Then, adopting a half-tone mask to expose the photoresist layer 23. The photoresist which is fully exposed can be removed by a developer. The photoresist which is not exposed is not removed by the developer. The photoresist which is half exposed can be partially removed such that the photoresist layer 23 after being exposed is only reserved in the first region 201, the second region 202 and the third region 203 as shown in FIG. 2. Besides, a thickness of the photoresist layer 23 after being exposed at the second region 202 is greater than a thickness of the photoresist layer 23 after being exposed at the first region 201, and is also greater than a thickness of the photoresist layer 23 after being exposed at the third region 203. The thickness of the photoresist layer 23 after being exposed at the first region 201 and the second region 202 can be the same.

Then, performing a first etching process in order to remove the aluminum layer 21 and the anti-oxidation layer 22 not covered by the photoresist layer 23. The first etching process can adopt a wet etching, that is, through a corrosion solution to submerge the photoresist layer 23. The aluminum layer 21 and the anti-oxidation layer 22 not covered by the photoresist layer 23 will generate a chemical reaction with the corrosion solution so as to be dissolved in the corrosion solution. The aluminum layer 21 and the anti-oxidation layer 22 covered by the photoresist layer 23 will not generate a chemical reaction with the corrosion solution because of a barrier function of the photoresist layer 23 so as to be reserved.

Furthermore, ashing the photoresist layer 23 in order to remove the photoresist layer 23 located at the first region 201 and the third region 203. Comparing with the photoresist layer 23 after being exposed, the thickness of the photoresist layer 23 at the second region after ashing become smaller, but can be reserved.

Performing a second etching process in order to remove the anti-oxidation layer 22 located at the first region 201 and the third region 203. The second etching process can adopt a dry etching. For example, adopting bombarding the anti-oxidation layer 22 at the first region 201 and the third region 203 using a plasma gas in order to remove the anti-oxidation layer 22 at the two regions. Then, stop etching. After the second etching process, the aluminum layer 21 at the first region 201 and the third region 203 are unchanged.

Finally, removing the photoresist layer 23 located at the second region 202. At this point, the aluminum layer 21 and the anti-oxidation layer 22 having a preset pattern are obtained. That is, along a direction in parallel with the base substrate 20, the aluminum layer 21 is formed at the first region 201, the second region 202 and the third region 203. An orthographic projection of the anti-oxidation layer 22 on the base substrate 20 is overlapped with the second region 202.

Of course, after forming an entire surface of the aluminum layer 21 and an entire surface of the anti-oxidation layer 22, another embodiment of the present invention can only form a photoresist layer 23 at the anti-oxidation layer 22 located at the second region 202. That is, an orthographic projection of the photoresist layer 23 on the base substrate 20 is overlapped with the second region 202. Then, performing a dry etching to the anti-oxidation layer 22 not covered by the photoresist layer 23 in order to remove the anti-oxidation layer 22 not covered by the photoresist layer 23. Finally, removing the photoresist layer 23 in order to obtain the aluminum layer 21 and the anti-oxidation layer 22 having a preset pattern.

Or, in another embodiment of the present invention, it can also adopt a PVD method to directly form the aluminum layer 21 and the anti-oxidation layer 22 having a preset pattern on the base substrate 20.

S12: forming an amorphous oxide semiconductor layer covering the aluminum layer on the anti-oxidation layer.

Figure 3:
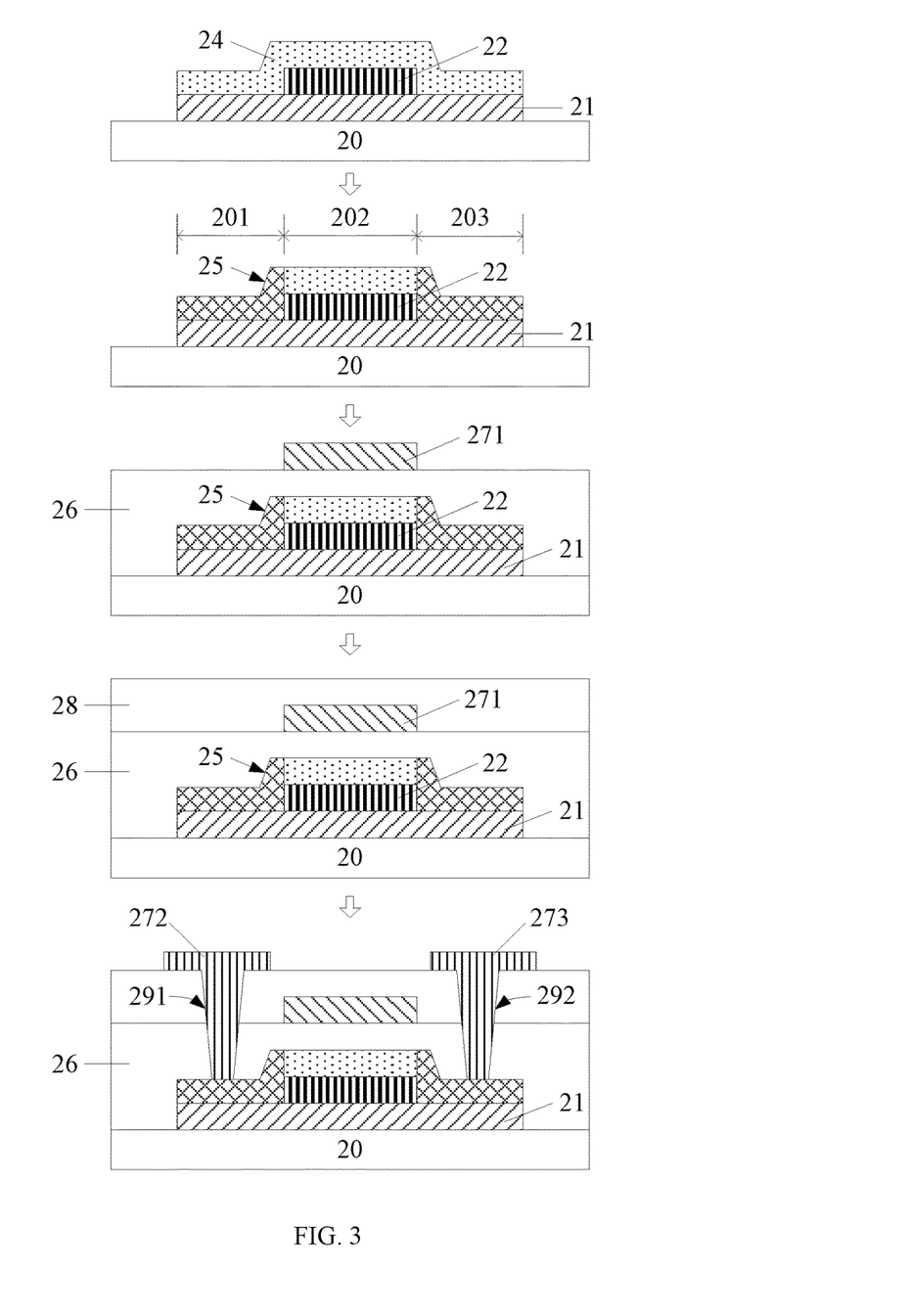
FIG. 3 is a schematic diagram of forming a thin-film transistor on the aluminum layer and the anti-oxidation layer shown in FIG. 2 based on the method shown in FIG. 1.

With reference to FIG. 2 and FIG. 3, the present embodiment can adopt a PVD method to form an entire surface of an amorphous oxide semiconductor layer 24 covering on the base substrate 20. The material of the amorphous oxide semiconductor layer 24 includes but not limited to IGZO. Then, the present embodiment can only reserve the amorphous oxide semiconductor layer 24 located at the first region 201, the second region 202 and the third region 203 through photoresist coating, exposing and etching.

S13: performing an annealing treatment to the amorphous oxide semiconductor layer such that in the annealing treatment, the aluminum layer at the first region and the third region generates an oxidation reaction in order to form $Al_2O_3$. Besides, the amorphous oxide semiconductor layer at the first region and the third region generates a crystallization reaction in order to form a source contact region and a drain contact region, and form a channel region at the second region shielded by the anti-oxidation layer.

In the annealing process, the aluminum layer 21 combines with oxygen ions in the amorphous oxide semiconductor layer 24 to form an $Al_2O_3$ layer. When the amorphous oxide semiconductor layer 24 loses the oxygen ions, oxygen defects are increased such that at doped region of two terminals of the amorphous oxide semiconductor layer 24 (that is, a portion of the amorphous oxide semiconductor layer 24 located at the first region 201 and the third region 203), a doped semiconductor layer 25 is formed such as N+IGZO layer. The crystal direction is from the first region 201 and the third region 203 toward the second region 202. The directional crystallization can ensure the crystallization efficiency and crystallization uniformity in order to reduce the affection of the grain boundaries to the electron mobility and leakage current in order to guarantee the electrical characteristics of the semiconductor layer 25.

After the annealing treatment, two terminals of the amorphous oxide semiconductor layer 24 respectively forms a source contact region and a drain contact region, and a middle portion of the amorphous oxide semiconductor layer 24 shielded by the anti-oxidation layer 22 (that is a portion located in the second region 202) forms a channel region. Besides, after the crystallization is finished, doped ions in the channel region is less and the electron mobility is lower in order to reduce the leakage current of the TFT. The doped ions in the source contact region and the drain contact region is more, the electron mobility is higher so as to decrease a contact impedance of the source electrode and the drain electrode of TFT formed subsequently.

Thus, the present embodiment can obtain a semiconductor layer 25 having a good electrical property through the annealing treatment. Besides, because the process of the annealing treatment is simple, the present embodiment can simplify the manufacturing process, which is beneficial to the production efficiency and decrease the production cost.

Wherein, the anti-oxidation layer 22 is used for insulating the amorphous oxide semiconductor layer 24 and the aluminum layer 21, preventing the oxygen ions of the amorphous oxide semiconductor layer 24 at the second region 202 from combining with the aluminum layer 21 so as to form the $Al_2O_3$ layer. Accordingly, the anti-oxidation layer 22 of the present embodiment requires adopting a material not easily to be oxidized such as molybdenum or titanium.

S14: forming a gate insulation layer on the amorphous oxide semiconductor layer after being performed with the annealing treatment.

The present embodiment can adopt a CVD (Chemical Vapor Deposition) method to form the gate insulation layer (GI) 26 on the semiconductor layer 25. The gate insulation layer 26 is an entire surface structure covering the base substrate 20. Wherein, the material of the gate insulation layer 26 can be silicon oxide ($SiO_x$). Of course, the gate insulation layer 26 can also include a silicone compound layer and silicon nitride compound layer sequentially formed on the semiconductor layer 25 such as silicon dioxide ($SiO_2$) and silicon nitride ($Si_3N_4$) in order to further increase the wear resistance ability and the insulation ability of the gate insulation layer 26.

S15: forming a gate electrode pattern on the gate insulation layer, the gate electrode pattern is located between the source contact region and the drain contact region, and located correspondingly above the channel region.

The present embodiment can adopt patterning processes such as photoresist coating, exposing, developing and etching to form the gate electrode pattern 271 having a preset pattern. Because the gate electrode pattern 271 is located above the semiconductor layer 25, the TFT of the present embedment can be regarded as a top gate design. Therefore, in the exposing process, the present embodiment can adopt a photolithography process illuminated at a back surface in order to form the gate electrode pattern 271 on the gate insulation layer 26. The photolithography process utilizes the aluminum layer after being performed with an annealing treatment (that is, the aluminum layer 21 at the second region 202) as a light-shielding layer, and illuminating at a side of the light-shielding layer back to the anti-oxidation layer 22 so as to omit a mask using as a light-shielding layer in the conventional art in order to further simplify the manufacturing process.

S16: forming an interlayer dielectric layer on the gate electrode pattern.

The present embodiment can adopt a CVD method to form an interlayer dielectric layer 28 on the gate electrode pattern 271. The interlayer dielectric layer (IDL, as known as a dielectric layer) 28 is an entire surface structure covering on the gate insulation layer 26.

S17: forming a source electrode pattern and a drain electrode pattern on the interlayer dielectric layer, the source electrode pattern is connected with the source contact region and the drain electrode pattern is connected with the drain contact region.

With reference to FIG. 3, the present embodiment can form contact holes 291, 292 through photoresist coating, exposing, developing and etching. The contact holes 291, 292 both passes through the gate insulation layer 26 and the interlayer dielectric layer 28, and exposes upper surfaces of the source contact region and drain contact region of the semiconductor layer 25. Then, the present embodiment can adopt a PVD method and a patterning process to form the source electrode pattern 272 and the drain electrode pattern 273 on the interlayer dielectric layer 28, the source electrode pattern 272 is connected with the source contact region of the semiconductor layer 25 through the contact hole 291, and the drain electrode pattern 273 is connected with the drain contact region of the semiconductor layer 25 through the contact hole 292.

Through the above method, the thin-film transistor required by the present invention can be obtained.

Figure 4:
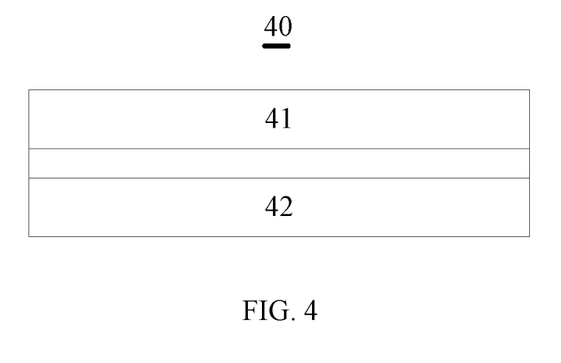
FIG. 4 is a schematic diagram of a cross-sectional structure of a display panel according to an embodiment of the present invention.

The present invention also provides a display panel. As shown in FIG. 4, the liquid crystal display panel 40 can include a first substrate 41 and a second substrate 42. The above thin-film transistor can be form on the first substrate 41 or the second substrate 42. Therefore, the display panel 40 also has the above beneficial effect. Wherein, the display panel 40 can be a liquid crystal display panel, or an AMOLED (Active-matrix organic light emitting diode).

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for a thin-film transistor, comprising:
   sequentially forming an aluminum layer and an anti-oxidation layer having a preset pattern on a base substrate, wherein the base substrate is provided with a first region, a second region and a third region arranged adjacently along a direction in parallel with the base substrate, the aluminum layer is formed in the first region, the second region and the third region, and the anti-oxidation layer is formed in the second region;
   forming an amorphous oxide semiconductor layer covering the aluminum layer on the anti-oxidation layer;

performing an annealing treatment to the amorphous oxide semiconductor layer such that in the annealing treatment, the aluminum layer at the first region and the third region generates an oxidation reaction in order to form $Al_2O_3$; the amorphous oxide semiconductor layer at the first region and the third region generates a crystallization reaction in order to form a source contact region and a drain contact region, and form a channel region at the second region shielded by the anti-oxidation layer;

forming a gate insulation layer on the amorphous oxide semiconductor layer after being performed with the annealing treatment;

forming a gate electrode pattern on the gate insulation layer, the gate electrode pattern is located between the source contact region and the drain contact region, and located correspondingly above the channel region;

forming an interlayer dielectric layer on the gate electrode pattern; and forming a source electrode pattern and a drain electrode pattern on the interlayer dielectric layer, the source electrode pattern is connected with the source contact region and the drain electrode pattern is connected with the drain contact region.

2. The manufacturing method according to claim 1, wherein, the step of sequentially forming an aluminum layer and an anti-oxidation layer having a preset pattern on a base substrate comprises:

sequentially forming the aluminum layer and the anti-oxidation layer covering the base substrate on the base substrate;

forming a photoresist layer on the anti-oxidation layer;

adopting a half-tone mask to expose the photoresist layer such that the photoresist layer after being exposed is formed at the first region, the second region and the third region; a thickness of the photoresist layer at the second region is greater than a thickness of the photoresist layer at anyone of the first region and the third region;

performing a first etching process in order to remove the aluminum layer and the anti-oxidation layer not covered by the photoresist layer after being exposed;

ashing the photoresist layer after being exposed in order to remove the photoresist layer located at the first region and the third region, and reserved the photoresist layer at the second region;

performing a second etching process in order to remove the anti-oxidation layer located at the first region and the third region, and not being shielded by the photoresist layer at the second region; and removing the photoresist layer located at the second region.

3. The manufacturing method according to claim 2, wherein, the first etching process adopts a wet etching, and the second etching process adopts a dry etching.

4. The manufacturing method according to claim 1, wherein, the step of sequentially forming an aluminum layer and an anti-oxidation layer having a preset pattern on a base substrate comprises:

sequentially forming the aluminum layer and the anti-oxidation layer covering the base substrate on the base substrate;

forming a photoresist layer on the anti-oxidation layer, and an orthographic projection of the photoresist layer on the base substrate is overlapped with the second region; and performing an etching process to the anti-oxidation layer not covered by the photoresist layer in order to remove the anti-oxidation layer not covered by the photoresist layer.

5. The manufacturing method according to claim 4, wherein, adopting a dry etching to etch the anti-oxidation layer not covered by the photoresist layer.

6. The manufacturing method according to claim 1, wherein, the anti-oxidation layer includes a molybdenum layer.

7. The manufacturing method according to claim 1, wherein, adopting a photolithography process illuminated at a back surface in order to form the gate electrode pattern on the gate insulation layer, and the photolithography process utilizes the aluminum layer at the second region as a light-shielding layer, and illuminating at a side of the light-shielding layer back to the anti-oxidation layer.

8. The manufacturing method according to claim 1, wherein, the step of forming a source electrode pattern and a drain electrode pattern on the interlayer dielectric layer comprise:

forming two contact holes that both passes through the gate insulation layer and the interlayer dielectric layer, and the two contact holes respectively expose the source contact region and the drain contact region; and forming the source electrode pattern and the drain electrode pattern on the interlayer dielectric layer, and the source electrode pattern and the drain electrode pattern are respectively formed in the two contact holes.

9. A thin-film transistor, comprising:

a $Al_2O_3$ layer and an aluminum layer having a preset pattern on a base substrate, wherein the base substrate is provided with a first region, a second region and a third region arranged adjacently along a direction in parallel with the base substrate, the $Al_2O_3$ layer is formed in the first region and the third region, and the aluminum layer is formed in the second region;

an anti-oxidation layer located on the aluminum layer, and an orthographic projection of the anti-oxidation layer on the base substrate is overlapped with the second region;

a semiconductor layer located on the anti-oxidation layer and including a source contact region, a drain contact region and a channel region, an orthographic projection of the source contact region on the base substrate is overlapped with the first region, an orthographic projection of the drain contact region on the base substrate is overlapped with the third region, and an orthographic projection of the channel region on the base substrate is overlapped with the second region;

a gate insulation layer located on the semiconductor layer;

a gate electrode pattern located on the gate insulation layer, and the gate electrode pattern is located between the source contact region and the drain contact region, and located correspondingly above the channel region;

an interlayer dielectric layer located on the gate electrode pattern; and a source electrode pattern and a drain electrode pattern on the interlayer dielectric layer, wherein the source electrode pattern is connected with the source contact region and the drain electrode pattern is connected with the drain contact region.

10. The thin-film transistor according to claim 9, wherein, the anti-oxidation layer includes a molybdenum layer.

11. The thin-film transistor according to claim 9, wherein, the gate insulation layer includes a silicone compound layer and silicon nitride compound layer sequentially formed on the semiconductor layer.

12. The thin-film transistor according to claim 9, wherein, the thin-film transistor further includes two contact holes that both passes through the gate insulation layer and the interlayer dielectric layer, and the two contact holes respectively expose the source contact region and the drain contact region, the source electrode pattern and the drain electrode pattern are respectively formed in the two contact holes.

13. A display panel having a thin-film transistor, and the thin-film transistor comprises:
- a $Al_2O_3$ layer and an aluminum layer having a preset pattern on a base substrate, wherein the base substrate is provided with a first region, a second region and a third region arranged adjacently along a direction in parallel with the base substrate, the $Al_2O_3$ layer is formed in the first region and the third region, and the aluminum layer is formed in the second region;
- an anti-oxidation layer located on the aluminum layer, and an orthographic projection of the anti-oxidation layer on the base substrate is overlapped with the second region;
- a semiconductor layer located on the anti-oxidation layer and including a source contact region, a drain contact region and a channel region, an orthographic projection of the source contact region on the base substrate is overlapped with the first region, an orthographic projection of the drain contact region on the base substrate is overlapped with the third region, and an orthographic projection of the channel region on the base substrate is overlapped with the second region;
- a gate insulation layer located on the semiconductor layer;
- a gate electrode pattern located on the gate insulation layer, and the gate electrode pattern is located between the source contact region and the drain contact region, and located correspondingly above the channel region;
- an interlayer dielectric layer located on the gate electrode pattern; and
- a source electrode pattern and a drain electrode pattern on the interlayer dielectric layer, wherein the source electrode pattern is connected with the source contact region and the drain electrode pattern is connected with the drain contact region.

14. The display panel according to claim 13, wherein, the anti-oxidation layer includes a molybdenum layer.

15. The display panel according to claim 13, wherein, the gate insulation layer includes a silicone compound layer and silicon nitride compound layer sequentially formed on the semiconductor layer.

16. The display panel according to claim 13, wherein, the thin-film transistor further includes two contact holes that both passes through the gate insulation layer and the interlayer dielectric layer, and the two contact holes respectively expose the source contact region and the drain contact region, the source electrode pattern and the drain electrode pattern are respectively formed in the two contact holes.

* * * * *